United States Patent [19]

Miyazawa et al.

[11] Patent Number: 4,829,534
[45] Date of Patent: May 9, 1989

[54] SEMICONDUCTOR LASER DEVICE HAVING A SEMICONDUCTOR REGION FOR CREATING A DEPLETION LAYER IN A LASER ACTIVE LAYER FOR CONTROLLING CURRENT FLOW THERETHROUGH

[76] Inventors: Seiichi Miyazawa; Hidetoshi Nojiri; Toshitami Hara; Akira Shimizu; Yoshinobu Sekiguchi; Isao Hakamada, all of c/o Canon Kabushiki Kaisha 30-2, 3-chome, Shimomaruko, Ohta-ku, Tokyo, Japan

[21] Appl. No.: 814,772

[22] Filed: Dec. 30, 1985

[30] Foreign Application Priority Data

Jan. 8, 1985 [JP] Japan ................................. 60-423

[51] Int. Cl.⁴ .............................................. H01S 3/19
[52] U.S. Cl. ......................................... 372/46; 357/16; 357/17; 372/44; 372/45
[58] Field of Search ............... 372/44, 45, 46; 357/17, 357/16

[56] References Cited

U.S. PATENT DOCUMENTS 4,534,033 8/1985 Nishizawa et al. .................... 372/46

Primary Examiner—William L. Sikes
Assistant Examiner—Georgia Y. Epps

[57] ABSTRACT

A semiconductor laser device wherein a depletion layer is formed in a laser activation layer by biasing the laser device and a third terminal controls an injection current flowing between first and second terminals of the device.

3 Claims, 3 Drawing Sheets

SEMICONDUCTOR LASER DEVICE HAVING A SEMICONDUCTOR REGION FOR CREATING A DEPLETION LAYER IN A LASER ACTIVE LAYER FOR CONTROLLING CURRENT FLOW THERETHROUGH

BACKGROUND OF THE INVENTION

The present invention relates to a semiconductor laser device which controls an injection current by creating a depletion layer at least in an activation layer.

In the past, a light of a semiconductor laser has been controlled by directly controlling an injection current to the semiconductor laser.

FIG. 1 shows a sectional view and a drive circuit of a prior art semiconductor laser device. The semiconductor laser device is formed by laminating a clad layer 2 of semiconductor laser device wherein a laser beam, on a semiconductor laser substrate 1 made of GaAs, laminating thereon a GaAs activation layer 3 which emits a semiconductor laser beam, laminating thereon a clad layer 4 having the same function as that of the clad layer 2, laminating thereon an insulation layer 5 made of silicon oxide or silicon nitride which pinches an electric current, and finally forming electrodes 6 and 7 at the opposite ends. The GaAs layer 3 is formed between the GaAs layer 1, Al2GaAs layer 2 and the AlGaAs layer 4, insulation layer 5.

The driving of the semiconductor laser device thus constructed is controlled by an external current source 8. An electro-optical signal conversion apparatus which is simple in circuit configuration and is easy to modulate like the semiconductor laser device is a very important device. FIG. 2 shows the relationship between an injection current I and a laser beam output L when the semiconductor laser device is driven. As seen from FIG. 2, the semiconductor laser device does not generate the laser beam until the current I exceeds a predetermined level Ith, when it starts to oscillate. The laser beam output of the semiconductor laser device is usually modulated by the injection current. The semiconductor laser device is used for light communication and recording by controlling the current I within a region $\Delta I$ shown in FIG. 2. In recent years, the demand for high speed modulation has increased as a result of high density communication and high speed recording. However, where the semiconductor laser device is controlled by an external current as shown in FIG. 1, delay is involved and the voltage drop is large.

Accordingly, a device in which a field effect transistor (FET) and a semiconductor laser device are integrated as shown in FIG. 3 has been proposed. The device comprises a high resistance GaAs substrate 21, a semiconductor laser 22, an FET source 23, a gate 24 to which a modulation signal is applied, a drain 25 and one electrode 26 of the laser. In this device, the modulation signal is applied to the gate 24 to control a laser injection current flowing from the drain 25 to the electrode 26 to modulate the laser. Since the modulation signal applied to the gate 24 is smaller than the injection current in the laser 22, the problems of large signal delay and large voltage drop are resolved.

However, the semiconductor laser device shown in FIG. 3 requires the steps of etching of the substrate 21 and the formation of the source 23, gate 24 and drain 25 of the FET after the formation of the laser device 22, and there are problems in the connection of the laser device and the FET.

SUMMARY OF THE INVENTION

It is an object of the present invention to provide a semiconductor laser device which has an improved current control function and is simple to manufacture.

In order to achieve the above object, in accordance with the present invention, a depletion layer is formed in a laser activation layer by biasing the laser device and a third terminal to control an injection current flowing between first and second terminals.

DESCRIPTION OF THE PREFERRED EMBODIMENTS

Figure 4:
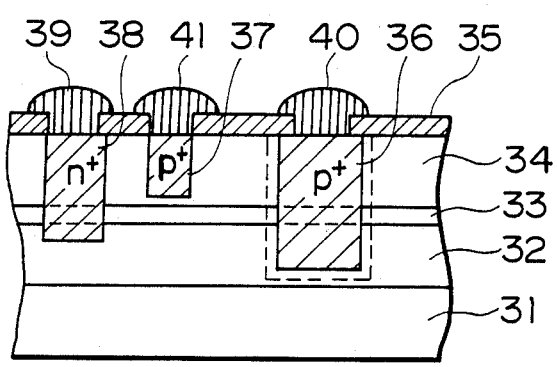
FIG. 4 is a sectional view of a first embodiment of the semiconductor laser device of the present invention.

FIG. 4 is a sectional view of a first embodiment of a semiconductor laser device of the present invention. The present embodiment comprises a semi-insulative GaAs substrate 31, a semi-insulative AlGaAs laser beam confining layer 32, an n-type GaAs laser activation layer 33, a non-doped AlGaAs laser beam confining layer 34, a current pinching silicon oxide or silicon nitride layer 35, a diffusion layer 36 for a laser p electrode, an ion injection layer 38 for a laser n electrode, electrodes 39, 40 and 41 and a current control diffusion layer 37 for controlling current flowing from the electrode 39 to the electrode 40. It has two spaced parallel end surfaces for laser oscillation. The diffusion layer 36 for the p electrode is joined to the layers 32, 33 and 34 and extends normally to the plane of the drawing between the two laser oscillation end surfaces. The ion injection layer for the n electrode is formed to join at least the laser activation layer 33.

The laser beam confining layers 32 and 34 and the laser activation layer 33 are formed by liquid phase growth method, molecule line growth method or a vapor phase growth method. The diffusion layers 36 and 37 are formed by diffusing Zn after the formation of the light beam confining layer 34, and the ion injection layer 38 is formed by an ion injection method. A thickness of the non-doped AlGaAs light beam confining layer 32 is 2 $\mu$m, a thickness of the Si-doped n-type GaAs laser activation layer 33 is 0.1–20 $\mu$m, and a thickness of the non-doped AlGaAs light beam confining layer 34 is up to 2 $\mu$m. A distance between the electrodes 39 and 40 is preferably less than 100 $\mu$m to reduce a resistance to the injection current.

In the present embodiment, current is supplied across the electrodes 39 and 40 to cause the activation layer 33 near the diffusion layer to emit a light. Because the AlGaAs light beam confining layers 32 and 34 are now of high resistance, the current concentrates in the activation layer 33. By applying a negative voltage to the P+ diffusion layer 37 to reversely bias it, the spread of the current is prevented and the current is effectively concentrated to the activation layer 33. Since the P+ concentration of the diffusion layer 37 is high, the depletion layer can be readily formed in the activation layer 33. When the P+ concentration is $1 \times 10^{18}$ cm$^{-3}$, the depletion layer of several thousands Å is formed in the activation layer 33 and the light beam confining layer 34 so that the laser beam output is more effectively controlled.

Figure 1:
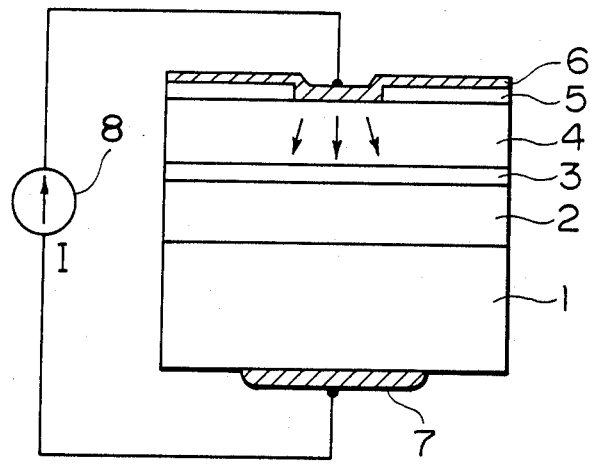
FIG. 1 shows a prior art semiconductor laser device and a drive method therefor.
Figure 2:
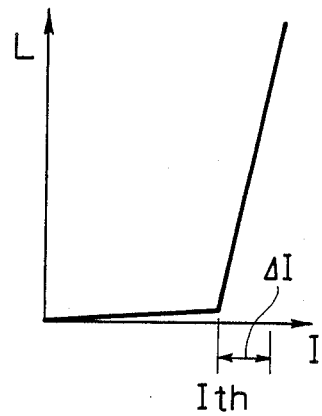
FIG. 2 shows a current-laser beam characteristic of the prior art device.
Figure 3:
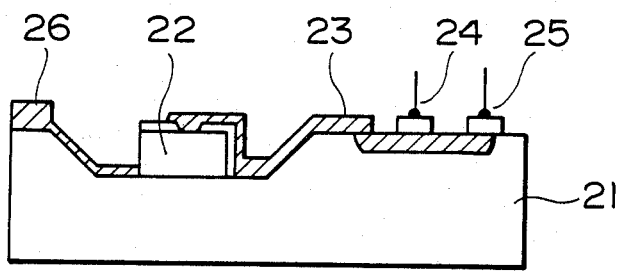
FIG. 3 is a sectional view of a prior art integrated semiconductor laser device.
Figure 5:
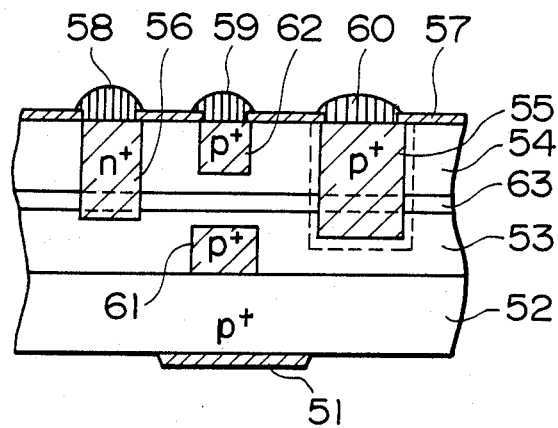
FIG. 5 is a sectional view of a second embodiment.

FIG. 5 shows a sectional view of a second embodiment of the semiconductor laser device of the present invention. In the present embodiment, a P+ gate layer 61 is formed to oppose the diffusion layer 62 with the activation layer 63 interposed therebetween, and an electrode 51 for the gate layer 61 is formed at the bottom of the substrate 52, in addition to the first embodiment shown in FIG. 1. As a result, the formation of the depletion layer in the activation layer 63 is further facilitated and the control is also facilitated.

The semiconductor laser device is formed by growing the semi-insulative AlGaAs layer 53 on the P+ GaAs substrate 52, forming the P+ layer 61 by the ion implanting method, and carrying out the same process as the first embodiment. The other elements are exactly the same as those of the first embodiment, and the device comprises the substrate 52, light beam confining layers 53 and 54, electrode diffusion layers 55 and 62, electrode ion implanted layer 56, silicon oxide or silicon nitride layer 57 and electrodes 58, 59 and 60.

Figure 6:
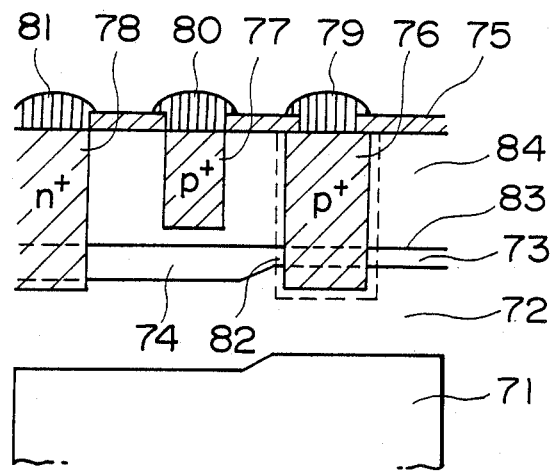
FIG. 6 is a sectional view of a third embodiment.

FIG. 6 shows a sectional view of a third embodiment of the semiconductor laser device of the present invention. In the present embodiment, the thickness of the region 73 of the activation layer joined to the diffusion layer 76 and the thickness of the region 74 of other activation layer are different. The activation layer region 74 is narrowed in the activation layer region 82 and extends to the activation layer region 73.

By expanding the activation layer region 74, a series resistance in the activation layer region 74 is reduced and the modulation of the laser beam emitted near the activation layer region is more easily controlled and the oscillation at a lower voltage with a lower power is attained. In the present embodiment, the GaAs substrate 71 is etched, the semi-insulative AlGaAs layer 72 is grown by 2 μm, and the Si-doped GaAs activation layer 73 is formed thereon. The thickness of the activation layer 73 is thick in the activation layer region 74 and thin in the activation layer region 76. Then, it is etched so that the upper surface 83 of the activation layer is parallel. Thereafter, the layers are laminated in the same manner as the first embodiment. Accordingly, the other elements are the same as those of the first embodiment, and the device comprises the light beam confining layer 84, silicon oxide or silicon nitride layer 75, electrode diffusion layers 76 and 77, ion implanted layer 78 and electrodes 79, 80 and 81.

In accordance with the present invention, the third terminal is provided in addition to the first and second terminals and the injection current is controlled by the depletion layer formed at least in the activation layer through the third terminal. Accordingly, the switching FET separate from the laser device is no longer necessary and the semiconductor laser device can be formed with a simpler process. The delay and voltage drop due to the external current control are diminished or eliminated and high speed modulation is accomplished.

We claim:

1. A semiconductor laser device comprising:
   a substrate;
   a first semiconductor layer, a laser active layer and a second semiconductor layer, said three layers being laminated in the named order on said substrate and said first and second semiconductor layers having a higher resistance than said laser active layer;
   a first semiconductor region formed in said second semiconductor layer being joined to said laser active layer and having a first conductivity type which is common to said laser active layer;
   a second semiconductor region formed in said second semiconductor layer being joined to said laser active layer and being spaced form said first semiconductor region, and having a second conductivity type;
   first and second electrodes connected to said first and second semiconductor regions, respectively, wherein light emission is effected by a current flowing between said first and second electrodes through said laser active layer;
   a third semiconductor region formed between said first and second semiconductor regions in said second semiconductor layer, and having the second conductivity type; and
   a third electrode connected to said third semiconductor region, a depletion layer for controlling the current flow through said laser active layer being formed in said laser active layer by applying a reverse biased voltage between said third semiconductor region and said laser active layer through said third electrode.

2. A semiconductor laser device according to claim 1, further comprising a fourth semiconductor region formed in said first semiconductor layer facing said third semiconductor region with said laser active layer being interposed therebetween, said fourth semiconductor region having the second conductivity type, and a fourth electrode connected to said fourth semiconductor region through said substrate.

3. A semiconductor laser device according to claim 1, wherein the thickness of a portion of said laser active layer where said laser active layer is joined to said first semiconductor layer, is thinner than that of other portions of said laser active layer.

* * * * *